US010910542B2

(12) United States Patent
Nakamura et al.

(10) Patent No.: US 10,910,542 B2
(45) Date of Patent: Feb. 2, 2021

(54) LAMINATED THERMOELECTRIC CONVERSION ELEMENT

(71) Applicant: Murata Manufacturing Co., Ltd., Nagaokakyo (JP)

(72) Inventors: Takanori Nakamura, Nagaokakyo (JP); Shuichi Funahashi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 15/015,359

(22) Filed: Feb. 4, 2016

(65) Prior Publication Data

US 2016/0155924 A1 Jun. 2, 2016

Related U.S. Application Data

(63) Continuation of application No. PCT/JP2014/068890, filed on Jul. 16, 2014.

(30) Foreign Application Priority Data

Aug. 9, 2013 (JP) ................. 2013-166567

(51) Int. Cl.
*H01L 35/32* (2006.01)
*H01L 35/34* (2006.01)
*H01L 35/20* (2006.01)

(52) U.S. Cl.
CPC ............. *H01L 35/32* (2013.01); *H01L 35/34* (2013.01); *H01L 35/20* (2013.01)

(58) Field of Classification Search
CPC .............................................. H01L 35/00–34

(Continued)

(56) References Cited

U.S. PATENT DOCUMENTS

2004/0140595 A1* 7/2004 Mihara ................ H01C 17/065
264/614
2009/0284896 A1* 11/2009 Sakaguchi ............. H01G 4/228
361/303

(Continued)

FOREIGN PATENT DOCUMENTS

FR 3035542 A1 * 10/2016 ............. H01L 35/32
JP 6-283765 A 10/1994

(Continued)

OTHER PUBLICATIONS

Partial translation of Traore et al. FR 3035542 A1 (Year: 2020).*

(Continued)

*Primary Examiner* — Magali P Slawski
(74) *Attorney, Agent, or Firm* — Arent Fox LLP (57) ABSTRACT

A laminated thermoelectric conversion element is a laminated thermoelectric conversion element that has: a first end surface and a second end surface opposed to each other; a heat absorption surface; and a heat release surface, where p-type thermoelectric conversion material layers and n-type thermoelectric conversion material layers are electrically connected and at the same time, laminated alternately in a meander form with insulating layers partially interposed there between, in an intermediate part, the p-type thermoelectric conversion material layers are laminated which have a p-type basic thickness, whereas the n-type thermoelectric conversion material layers are laminated which have an n-type basic thickness, and the thickness of the p-type thermoelectric conversion material layer or n-type thermoelectric conversion material layer outside the insulating layer located closest to any of the first end surface and second end surface is larger as compared with the basic thickness of the thermoelectric conversion material layer with the same type of conductivity.

20 Claims, 10 Drawing Sheets

(58) Field of Classification Search
USPC .................................................. 136/200–242
See application file for complete search history.

(56) References Cited

U.S. PATENT DOCUMENTS

| | | | |
|---|---|---|---|
| 2010/0116308 A1 | 5/2010 | Hayashi et al. | |
| 2010/0118467 A1* | 5/2010 | Takeuchi | H01G 4/232 |
| | | | 361/306.3 |
| 2010/0193004 A1* | 8/2010 | Hiroyama | H01L 35/32 |
| | | | 136/239 |
| 2010/0288325 A1* | 11/2010 | Takahashi | H01L 35/06 |
| | | | 136/205 |
| 2011/0220162 A1* | 9/2011 | Siivola | H01L 35/32 |
| | | | 136/203 |
| 2011/0226304 A1 | 9/2011 | Hayashi et al. | |
| 2013/0014798 A1* | 1/2013 | Nishide | H01L 35/20 |
| | | | 136/205 |
| 2014/0182644 A1* | 7/2014 | Aguirre | H05B 3/265 |
| | | | 136/200 |
| 2014/0305479 A1* | 10/2014 | Nemir | H01L 35/32 |
| | | | 136/203 |
| 2016/0035957 A1* | 2/2016 | Casey | H01L 35/30 |
| | | | 136/230 |

FOREIGN PATENT DOCUMENTS

| | | |
|---|---|---|
| JP | 8-125240 A | 5/1996 |
| JP | 11-121815 A | 4/1999 |
| JP | 2002-299706 A | 10/2002 |
| JP | 2007-109990 A | 4/2007 |
| JP | 2006-203070 A | 8/2007 |
| WO | WO 2009001691 A | 12/2008 |
| WO | WO 2010/058464 A | 5/2010 |
| WO | WO 2013/027661 A | 2/2013 |

OTHER PUBLICATIONS

PCT/JP2014/068890 International Search Report dated Oct. 21, 2014.
PCT/JP2014/068890 Written Opinion dated Oct. 21, 2014.

* cited by examiner

FIG. 1

PRIOR ART

FIG. 2

PRIOR ART

LAMINATED THERMOELECTRIC CONVERSION ELEMENT

CROSS REFERENCE TO RELATED APPLICATIONS

The present application is a continuation of International application No. PCT/JP2014/068890, filed Jul. 16, 2014, which claims priority to Japanese Patent Application No. 2013-166567, filed Aug. 9, 2013, the entire contents of each of which are incorporated herein by reference.

TECHNICAL FIELD

The present invention relates to a laminated thermoelectric conversion element.

BACKGROUND ART

As an example of a laminated thermoelectric conversion element based on the prior art, International Publication No. WO 2009/001691, discloses an element referred to as a thermoelectric conversion module. This thermoelectric conversion module has a p-type oxide thermoelectric conversion material and an n-type oxide thermoelectric conversion material alternately laminated. The p-type oxide thermoelectric conversion material and n-type oxide thermoelectric conversion material adjacent to each other are directly joined in a first region, and joined with an insulating material interposed therebetween in a second region. For the manufacture of the thermoelectric conversion module, sheets of the p-type oxide thermoelectric conversion material and sheets of the n-type oxide thermoelectric conversion material are each formed and stacked to form a stacked body while providing the insulating material in a certain region, and this stacked body is subjected to firing. The firing makes the stacked body integrally sintered. External electrodes are formed on the sintered body.

SUMMARY OF THE INVENTION

Problem to be Solved by the Invention

Figure 12:
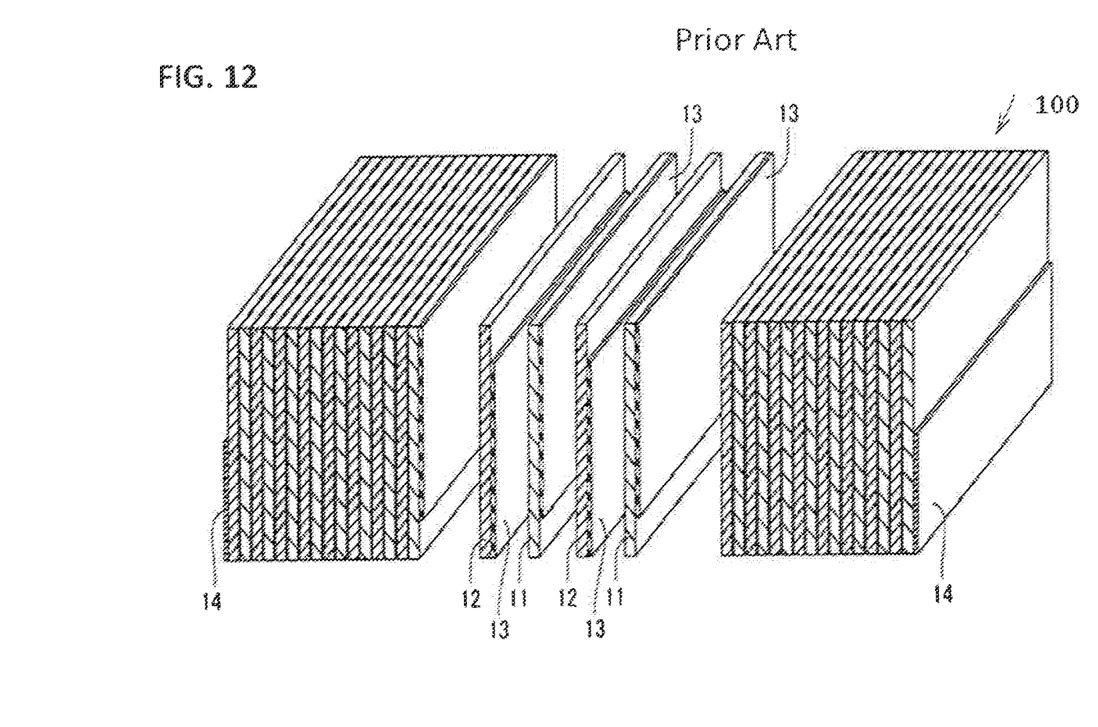
FIG. 12 is an explanatory diagram of a laminated thermoelectric conversion element based on the prior art.
Figure 13:
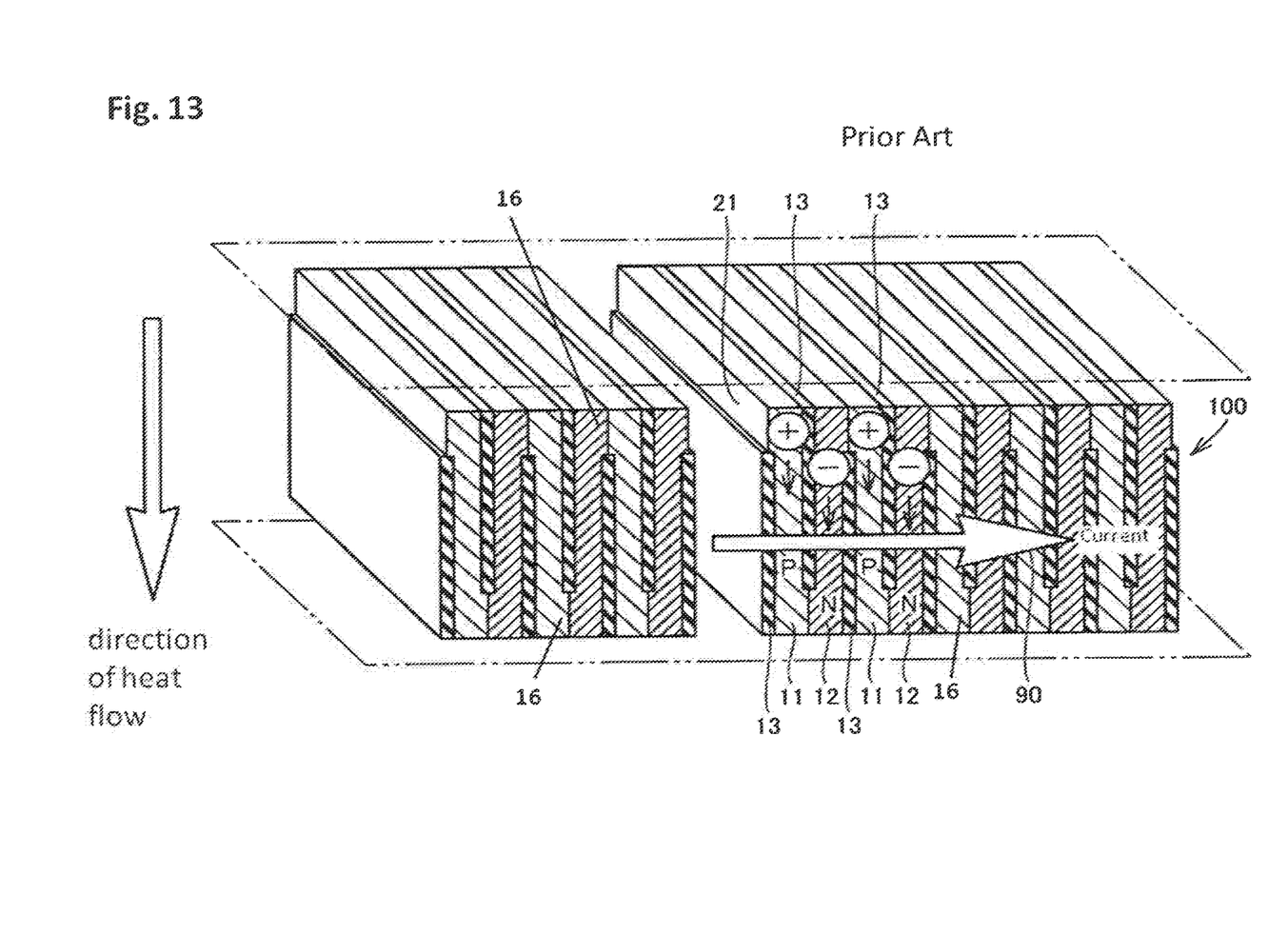
FIG. 13 is an explanatory diagram of the operation of the laminated thermoelectric conversion element based on the prior art.

A laminated thermoelectric conversion element 100 is shown in FIGS. 12 and 13. The element is originally integrated, but shown to be separated in the middle for the sake of explanation convenience. In this example, the upper side is a side that should reach a high temperature, whereas the lower side is a side that should reach a low temperature. P-type thermoelectric conversion material layers 11 and n-type thermoelectric conversion material layers 12 are laminated alternately while insulating layers 13 are interposed there between. Each insulating layer 13 extends only part way between the interface of adjacent thermoelectric conversion material layers. More particularly, each insulating layer extends from either from the top of the thermoelectric conversion element to a location above the bottom of the thermoelectric conversion element 100 or from the bottom of the thermoelectric conversion element 100 to a location below the top thereof. As a result there will be an interface 16 wherein adjacent thermoelectric conversion material layers abut one another. Each successive interface 16 is either at the top or the bottom of the thermoelectric conversion element 100. External electrodes 14 are formed on left and right end surfaces.

The p-type thermoelectric conversion material has a positive Seebeck coefficient and the n-type thermoelectric conversion material has a negative Seebeck coefficient. As a result, when a temperature difference is applied as shown in FIG. 13, holes (+) move in the p-type thermoelectric conversion material layers 11, whereas electrons (−) move in the n-type thermoelectric conversion material layers 12. Current will flow from one of the electrodes to the other in a meandering fashion via interfaces 16. The net effective flow of current is in the direction indicated by an arrow 90. With this structure a high electromotive force can be obtained depending on the number of laminated layers.

The length of each interface 16 (as measured vertically as viewed in FIGS. 12 and 13) affects the resistance to the current flow. The shorter the length, the higher the resistance. If the length is too small, the resistance will be high leading to a reduction of power.

Therefore, an object of the present invention is to provide a laminated thermoelectric conversion element which can avoid the resistance of the element from being increased due to reduction of the length of the interfaces where adjacent thermoelectric conversion material layers abut.

Means for Solving the Problem

In order to achieve the object mentioned above, the laminated thermoelectric conversion element in accordance with the present invention comprises a first and second opposing end surfaces having top and bottom sides;

a heat absorption surface extending from the top side of the first end surface to the top side of the second end surface; and a heat release surface opposed to the heat absorption surface and extending from the bottom side of the first end surface to the bottom side of the second end surface;

wherein as viewed from a first side surface connecting the heat absorption surface and the heat release surface, a plurality of p-type and n-type thermoelectric conversion material layers alternatively located adjacent one another with insulating layers interposed between portions of adjacent layers to form a serpentine path for the flow of current between first and second end surfaces of the thermoelectric conversion element;

the p-type thermoelectric conversion material layers located toward the middle of the thermoelectric conversion element as viewed from the first side surface having a p-type basic thickness;

the n-type thermoelectric conversion material layers located toward the middle of the thermoelectric conversion element as viewed from the first side surface having a n-type basic thickness; and a thickness of at least one of the p-type thermoelectric conversion material layers or the n-type thermoelectric conversion material layers located outside the insulating layer located closest to either the first and second end surfaces is larger than the basic thickness of the thermoelectric conversion material layer having the same type of conductivity.

The foregoing object is further achieved using a multilayer thermoelectric conversion element, comprising:

a plurality of p-type and n-type thermoelectric conversion material layers alternatively stacked on one another with insulating layers being interposed between adjacent layers to form a serpentine path for the flow of current between first and second end surfaces of the thermoelectric conversion element;

the thickness of the outer layers nearest the first and second end surfaces being greater than the thickness of at least some other layers which are located inwardly of the outer layers, each of the thicknesses being measured along a line extending between the first and second end surfaces.

The invention is further directed towards a process for laminating a multilayer thermoelectric conversion element having first and second end surfaces, comprising:

alternatively forming a plurality of p-type and n-type thermoelectric conversion material layers on top of one another with insulating layers being interposed between adjacent layers to form a serpentine path for the flow of current between first and second end surfaces of the thermoelectric conversion element;

forming at least the outermost material layers which are located nearest the first and second end surfaces such that the thickness of those outer layers are greater than the thickness of at least some other layers which are located inwardly of the outer layers, each of the thicknesses being measured along a line extending between the first and second end surfaces;

cutting the plurality of thermoelectric conversion material layers into individual thermoelectric conversion elements; and barrel polishing at least some of the thermoelectric conversion elements;

wherein, the thickness of the outermost layers being chosen so that the length of the interfaces at which the outermost layers abut their adjacent layers is at least substantially equal to the length of the interfaces at which the remaining layers abut their adjacent layers According to the present invention, it is possible to prevent the resistance value from being increased as a result of shortening the length interfaces between two adjacent thermoelectric conversion material layers.

MODE FOR CARRYING OUT THE INVENTION

In a typical process for manufacturing a laminated thermoelectric conversion element, sheets of p-type thermoelectric conversion material and sheets of n-type thermoelectric conversion material are formed in a large size and alternately stacked to obtain a stacked body. "Large size" as used herein means a size corresponding to a plurality of laminated thermoelectric conversion elements. The stacked body in an unfired state, referred to as a green body, is cut into individual laminated thermoelectric conversion elements. These elements are then barrel polished for deburring and fired. The order of the barrel polishing and firing may be reversed. More specifically, the green body may be subjected to firing first, and then barrel polishing second.

Figure 1:
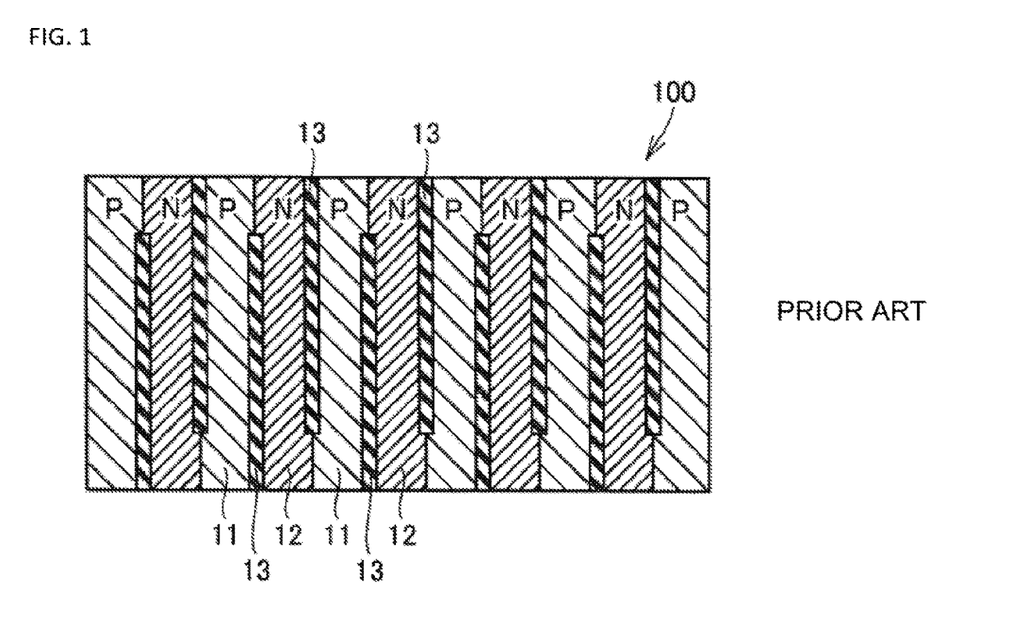
FIG. 1 is a cross-sectional view of a common laminated body before barrel polishing, to serve as a laminated thermoelectric conversion element.
Figure 2:
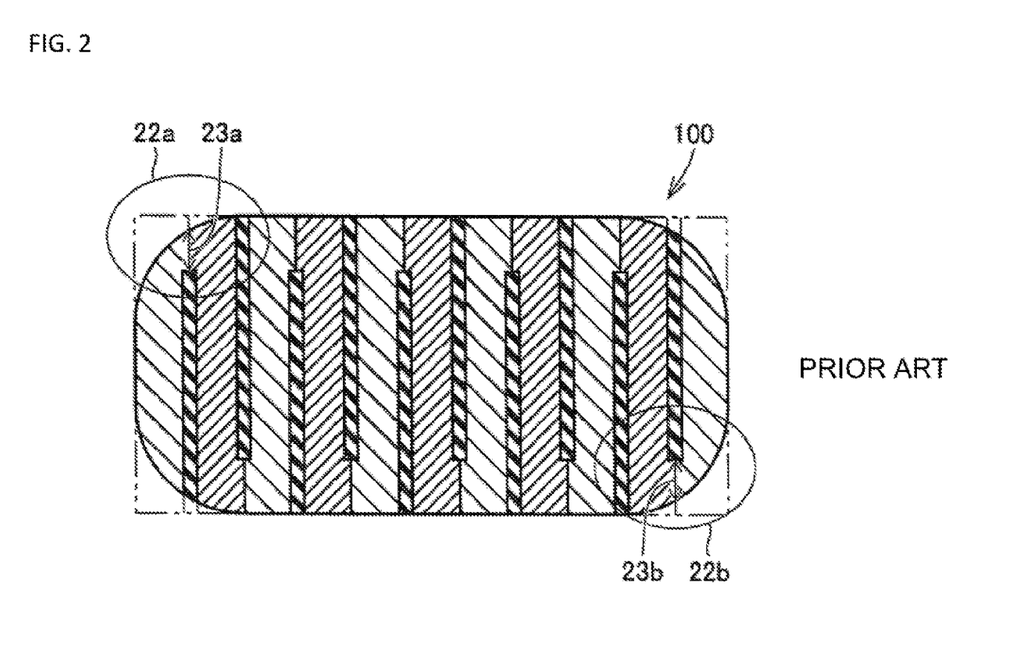
FIG. 2 is a cross-sectional view of a common laminated body after barrel polishing, to serve as a laminated thermoelectric conversion element.

During barrel polishing, corners of the stacked body are rounded in areas 22a and 22b as shown in FIG. 2. As a result, the length 23b of the outermost interfaces where the layers 11a and 12a abut is reduced and the resistance value in the area of these interfaces is increased.

To avoid this problem, the present invention increases the thickness of the layers (as measured in the horizontal direction in FIG. 2) which makes it less likely for the rounded corners formed by the barrel polishing will extend to the interfaces.

First Embodiment

Figure 3:
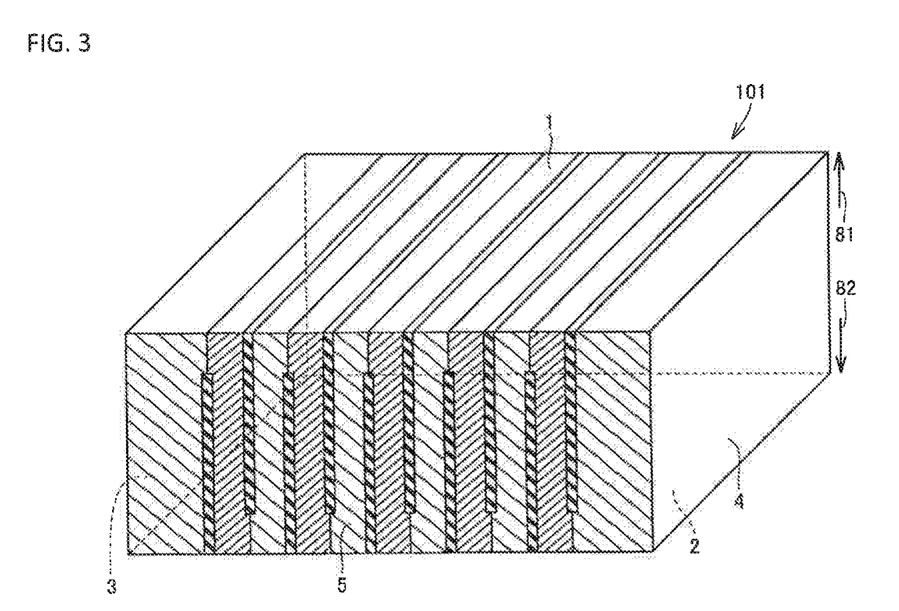
FIG. 3 is a perspective view of a laminated thermoelectric conversion element before barrel polishing according to First Embodiment in accordance with the present invention.
Figure 4:
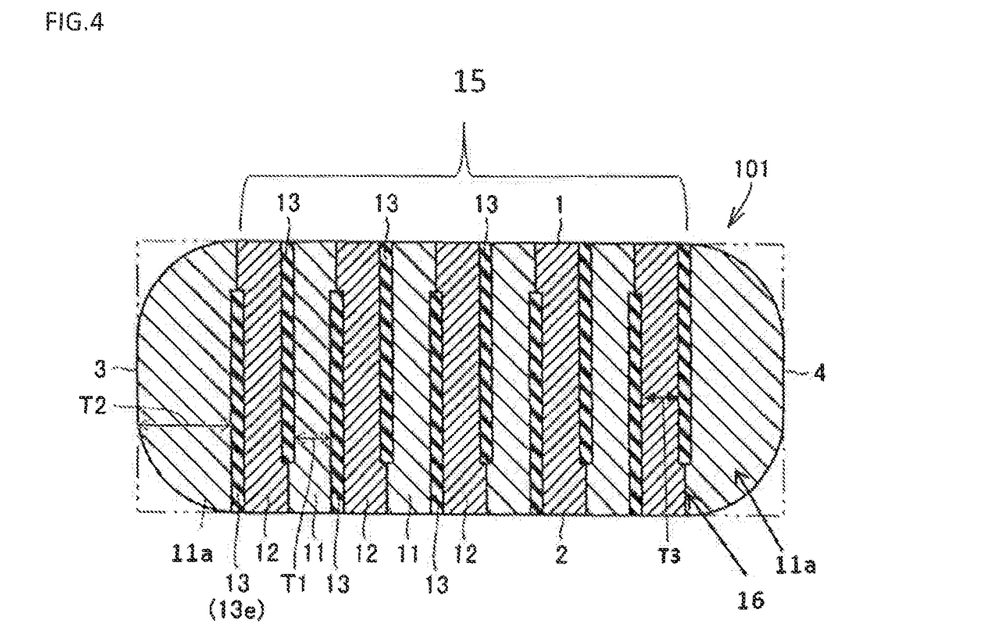
FIG. 4 is a cross-sectional view of the laminated thermoelectric conversion element according to First Embodiment in accordance with the present invention, as viewed from a first side surface.

A laminated thermoelectric conversion element 101 according to First Embodiment of the present invention will be described with reference to FIGS. 3 to 4. FIG. 3 generally shows the laminated thermoelectric conversion element 101 before barrel polishing.

The laminated thermoelectric conversion element 101 includes opposed first and second end surfaces 3 and 4; a heat absorption surface 1 extending from one end of the first end surface 3 on a first side 81 to an end of the second end surface 4 on the first side 81; and a heat release surface 2 extending from one end of the first end surface 3 on a second side 82 opposite to the first side 81 to one end of the second end surface 4 on the second side 82, and to be opposed to the heat absorption surface 1. The laminated thermoelectric conversion element 101 has a first side surface 5 that connects the heat absorption surface 1 and the heat release surface 2. FIG. 4 shows the laminated thermoelectric conversion element 101 as viewed from the first side surface 5 but after barrel polishing.

As viewed from the first side surface 5, p-type thermoelectric conversion material layers 11 and n-type thermoelectric conversion material layers 12 are laminated alternately with insulating layers 13 partially interposed there between such that the current follows a meandering path. In an intermediate region 15, the thickness of each of the p-type thermoelectric conversion material layers 11 in the horizontal direction (as viewed in FIG. 4) is equal to T1. The thickness of each of the n-type thermoelectric conversion material layers 12 (as viewed in the horizontal direction of FIG. 4) is T3. T1 and T3 may be equal or different.

In order to reduce the effect of the rounded corners on the resistance of the thermoelectric conversion element, the thickness T2 of the outermost thermoelectric conversion material layers 11a is made larger than the thickness T1 of the layers of the same conductivity type in the intermediate region 15. More specifically, the conditions T2>T1 is satisfied.

In the present embodiment, the thickness of the p-type thermoelectric conversion material layer 11 or n-type thermoelectric conversion material layer 12 outside the insulating layer 13 that is located closest to either the first end surface 3 and second end surface 4 is larger than the thickness of the thermoelectric conversion material layers in the intermediate region 15 having the same type of conductivity. As a result, interfaces 16 where the thermoelectric conversion material layers closest to end surfaces 3 and 4 abut are less likely to be affected by the rounded edges created by barrel polishing and it is possible to avoid, or at least reduce, the shortening of the length of these interfaces. Accordingly, an increase in the resistance value can be prevented, or at least ameliorated. More particularly, the thickness of the outermost layers 11a is selected to be sufficiently thick that the length (as viewed vertically in FIG. 4) of the interfaces 16 where they abut with the adjacent thermoelectric conversion layer is the same or substantially the same as the vertical length of interfaces where the adjacent thermoelectric conversion layers in the intermediate region is abut. As used herein, "substantially the same" length means within a variation of ±5%.

Second Embodiment

A laminated thermoelectric conversion element according to Second Embodiment in accordance with the present invention will be described with reference to FIG. 5. The laminated thermoelectric conversion element 102 according to this embodiment differs from the first embodiment in the following respect, although the basic configuration is common to the thermoelectric conversion element 101 described in First Embodiment.

In the laminated thermoelectric conversion element 102 according to the second embodiment, the thickness of a p-type thermoelectric conversion material layer 11a and an n-type thermoelectric conversion material layer 12a located outside the k-th insulating layer 13f (wherein k is an integer of 2 or more) in count from either the first end surface 3 or the second end surface 4 is larger than the basic thickness of the thermoelectric conversion material layer with the same type of conductivity (i.e., the thickness of the layers of the same conductivity type located inwardly of the kth layers).

Figure 5:
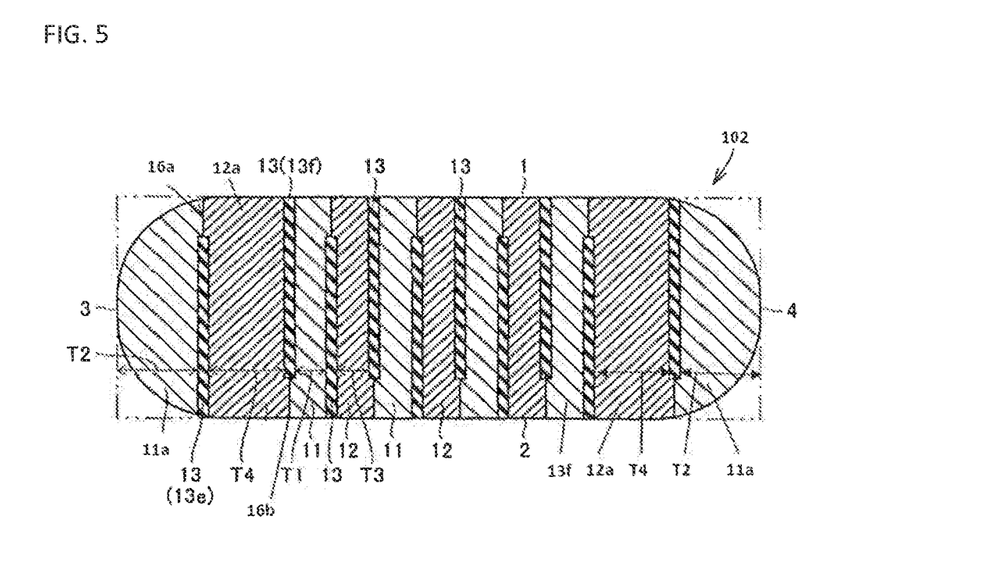
FIG. 5 is a cross-sectional view of a laminated thermoelectric conversion element according to Second Embodiment in accordance with the present invention.

In the example shown in FIG. 5, with k=2, the thickness T2 of the outermost p-type thermoelectric conversion material layers 11a and the thickness T4 of the outermost n-type thermoelectric conversion material layers 12a are larger than the thickness T1 (the basic thickness) of the p-type inner thermoelectric conversion material layers 11 and the thickness T3 (the basic thickness) of the n-type thermoelectric conversion material layers 12, respectively.

As a result, when corners are removed from the original cuboid state by barrel polishing, the length of the interfaces where the p-type and n-type thermoelectric conversion material layers abut can be kept from being significantly reduced. Even if the corners are sufficiently rounded to extend to the outermost interface 16a, they likely will not extend to the next outmost interface 16b. Accordingly the number of shortened interfaces can be reduced and the increase in the overall resistance value of the thermoelectric conversion element can be minimized.

Third Embodiment

Figure 6:
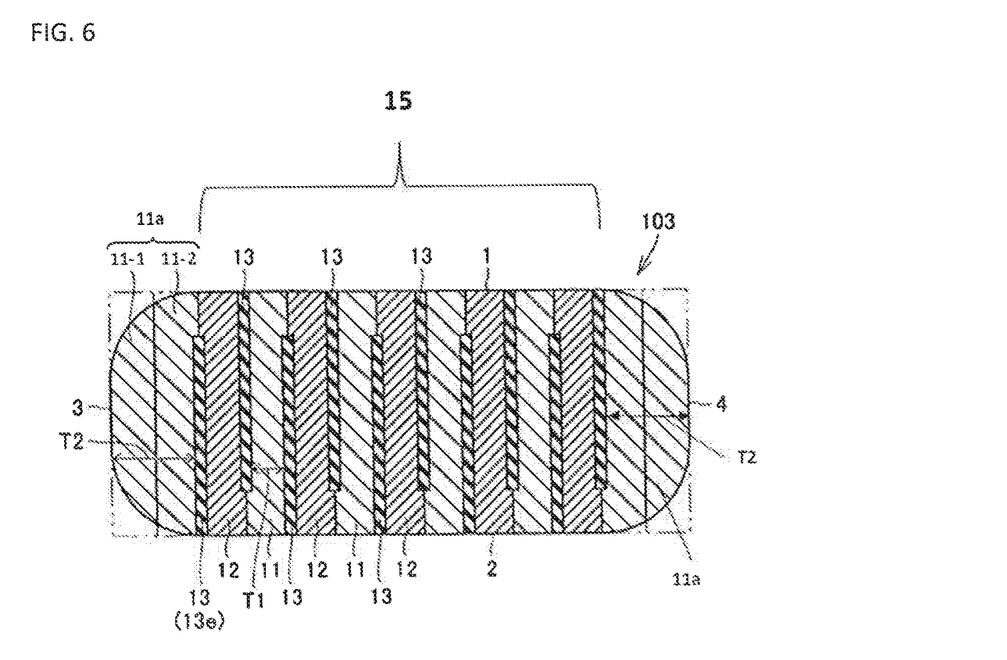
FIG. 6 is a cross-sectional view of a laminated thermoelectric conversion element according to Third Embodiment in accordance with the present invention.

A laminated thermoelectric conversion element according to Third Embodiment in accordance with the present invention will be described with reference to FIG. 6. The laminated thermoelectric conversion element 103 according to the third embodiment differs from the prior embodiments in the following respect, although the basic configuration is common to the thermoelectric conversion element 101 described in First Embodiment.

In the laminated thermoelectric conversion element 103 according to the present embodiment, the thickness of the outermost thermoelectric conversion material layers 11a is larger than the basic thickness of thermoelectric conversion material layers located in the intermediate region 15 and having the same conductivity type as the outermost thermoelectric conversion layers 11a. This is preferably achieved by repeatedly laminating the p-type thermoelectric conversion material layer having the p-type basic thickness or the n-type thermoelectric conversion material layer having the n-type basic thickness one on top of the other.

For example, when the p-type basic thickness is T1, the thickness T2 of the p-type thermoelectric conversion material layer 11a located outside the insulating layer 13e which is closest to the first end surface 3 is larger than the basic thickness t1 of the thermoelectric conversion material layer having the same type of conductivity. The layer 11a is preferably formed by repeatedly laminating the p-type thermoelectric conversion material layers having the p-type basic thickness T1 one on top of the other. In this embodiment, two p-type layers 11-1 and 11-2 are laminated to achieve the thickness T2. Therefore, the condition of T2=T1×2 is met.

The present embodiment can achieve the effect described in First Embodiment. Furthermore, because the thicker layers near the end surfaces 3 and 4 are formed by repeatedly laminating layers of the same conductivity type and having the basic thickness of the inner layers of the same conductivity type one on top of the other, there is no need to prepare sheets that differ in thickness. While the number of layers laminated for constituting the thicker part is two herein, more layers may be laminated. The thickness of the thicker part can be adjusted by appropriately adjusting the number of layers laminated.

Fourth Embodiment

Figure 7:
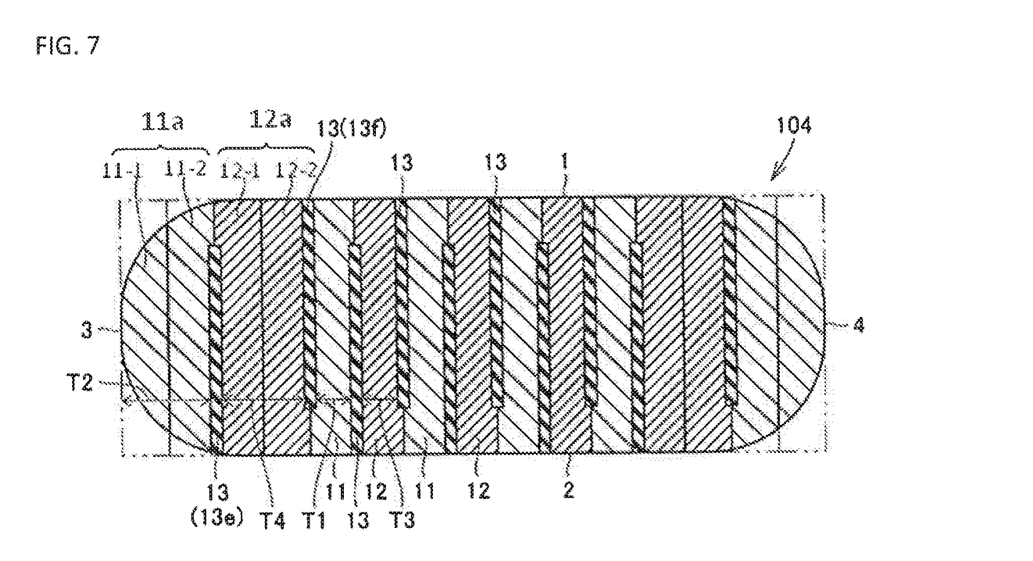
FIG. 7 is a cross-sectional view of a laminated thermoelectric conversion element according to Fourth Embodiment in accordance with the present invention.

A laminated thermoelectric conversion element according to Fourth Embodiment of the present invention will be described with reference to FIG. 7. The laminated thermoelectric conversion element 104 according to this embodiment differs from the foregoing embodiments in the following respect, although the basic configuration is common to the thermoelectric conversion element 102 described in Second Embodiment.

Like the prior embodiment, this embodiment forms the thickened layers by laminating several thermoelectric material layers have the basic thickness one on top of the other. However, in this embodiment, like the embodiment of FIG. 5, the outermost p-type thermoelectric conversion layers 11a are thicker (T2) than the basic thickness (T1) of the p-type thermoelectric conversion layers 12 located inside of the insulator layers 13e and the outermost n-type thermoelectric conversion layers 12a are thicker (T4) than the basic thickness (T3) of the n-type thermoelectric material layers located inside of insulator layers 13f. The layers 11a are formed by laminating a plurality of p-type thermoelectric conversion material layers with the p-type basic thickness T1 one on top of the other. The layers 12a are formed by laminating a plurality of n-type thermoelectric conversion material layers with the n-type basic thickness T1 one on top of the other.

In this example, the conditions of T2=T1×2 and T4=T3×2 are met. The p-type thermoelectric conversion material layer 11 outside the insulating layer 13 located closest to the first end surface 3 includes layers 11-1 and 11-2. The n-type thermoelectric conversion material layer 12 outside the insulating layer 13f located second closest to the first end surface 3 includes layer 12-1 and 12-2.

The present embodiment can achieve the effect described in Second Embodiment. Furthermore, the embodiment can also achieve the effect described in Third Embodiment. More specifically, the embodiment is also advantageous in that there is no need to prepare sheets that have a different thickness than the basic thickness. Rather a thicker part can be formed using only sheets having the same thickness as the basic thickness.

(Manufacturing Method)

An example of a manufacturing method will be described in preparing a laminated thermoelectric conversion element configured as described in Third and Fourth Embodiments.

Figure 8:
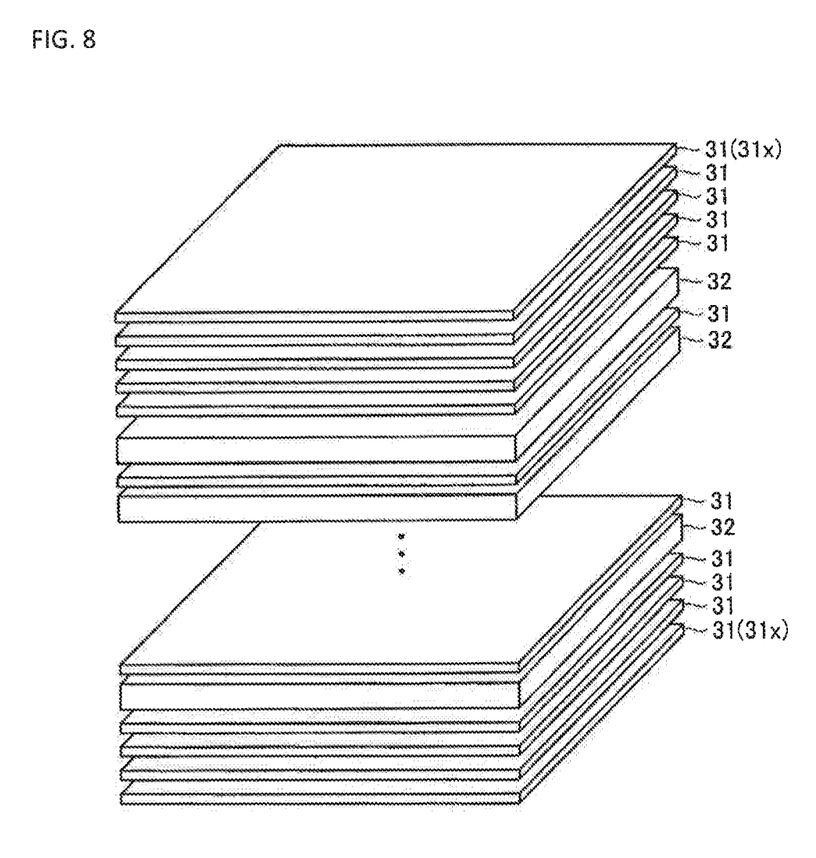
FIG. 8 is an explanatory diagram of a large-sized laminated body formed for obtaining the laminated thermoelectric conversion elements according to Third and Fourth Embodiments in accordance with the present invention.

As shown in FIG. 8, p-type thermoelectric conversion material sheets 31 and n-type thermoelectric conversion material sheets 32 are stacked in combination to form a large-sized stacked body. The p-type thermoelectric conversion material sheets 31 and the n-type thermoelectric conversion material sheets 32 are each a large-area sheet corresponding to a plurality of thermoelectric conversion elements. The large-sized stacked body is a large-size stacked body corresponding to a plurality of thermoelectric conversion elements. In an intermediate region 15 of the large-sized stacked body in the thickness direction thereof (in this Figure the thickness direction is the vertical direction as viewed in FIG. 8), the p-type and the n-type are alternately stacked, and in the uppermost region 17 and the lowermost region 18, the p-type thermoelectric conversion material sheets 31 are repeatedly stacked, rather than alternating the p-type and the n-type.

In FIG. 8, the p-type thermoelectric conversion material sheets 31 differ significantly in thickness from the n-type thermoelectric conversion material sheets 32. This is intended to make the electrical resistance value uniform in the p-type part and n-type part of the element as a whole, because the electrical resistivity differs between the both sheets due to the use of materials of different compositions for the both. Between the p-type and the n-type, layers of a material that is higher in electrical resistivity are formed to be thicker, whereas layers of a material that is lower in electrical resistivity are formed to be thinner.

The thus obtained large-sized stacked body includes therein a plurality of electrical connection routes in a meander form.

On the outer surfaces of the p-type thermoelectric conversion material sheets 31 stacked at the uppermost surface and lowermost surface of the large-sized stacked body (as viewed in FIG. 8), external electrodes or regions to be external electrodes for outputting electricity generated from the difference in temperature are arranged and formed so as to correspond to a plurality of laminated thermoelectric conversion elements.

The large-sized stacked body is divided into individual laminated thermoelectric conversion elements. The dividing operation may be performed by a well-known technique such as with a dicing saw. The thus divided stacked body is unfired, and thus referred to as a green body. The green body is then subjected to barrel polishing for deburring. Thereafter, firing is carried out. In this way, a fired body is obtained. Alternatively, the order of the barrel polishing and firing may be reversed. More specifically, the green body may be subjected to firing first, and then barrel polishing for deburring.

(Experiment)

The experiment performed for verifying advantageous effects of the present invention is described below.

A metal Ni powder and a metal Mo powder were prepared as starting raw materials for the p-type thermoelectric conversion material. On the other hand, La2O3, SrCO3, and TiO2 were prepared as starting raw materials for the n-type thermoelectric conversion material. These starting raw materials were used, and weighed so as to provide the p-type and n-type thermoelectric conversion materials of the following compositions.

Here is the p-type composition:

Ni0.9Mo0.120 wt %+(Sr0.965La0.035)TiO380 wt %

Here is the n-type composition:

(Sr0.965La0.035)TiO3

For the n-type, the raw material powder was mixed in a ball mill with pure water as a solvent over 16 hours. The obtained slurry was dried, and then subjected to calcination at 1300° C. in the atmosphere. The obtained n-type powder and the raw materials for the p-type powder were each subjected to grinding in a ball mill over 5 hours. The obtained powders were further mixed over 16 hours with the addition of an organic solvent, a binder, etc. thereto, and the obtained slurry was formed into sheets by a doctor blade method. In this way, p-type and n-type thermoelectric conversion material sheets were obtained.

On the other hand, a Zr0.97Y0.03O2 powder, varnish, and a solvent were mixed as materials for insulating layers, and prepared as a paste with a roll mill. This is referred to as an "insulating paste".

Figure 9:
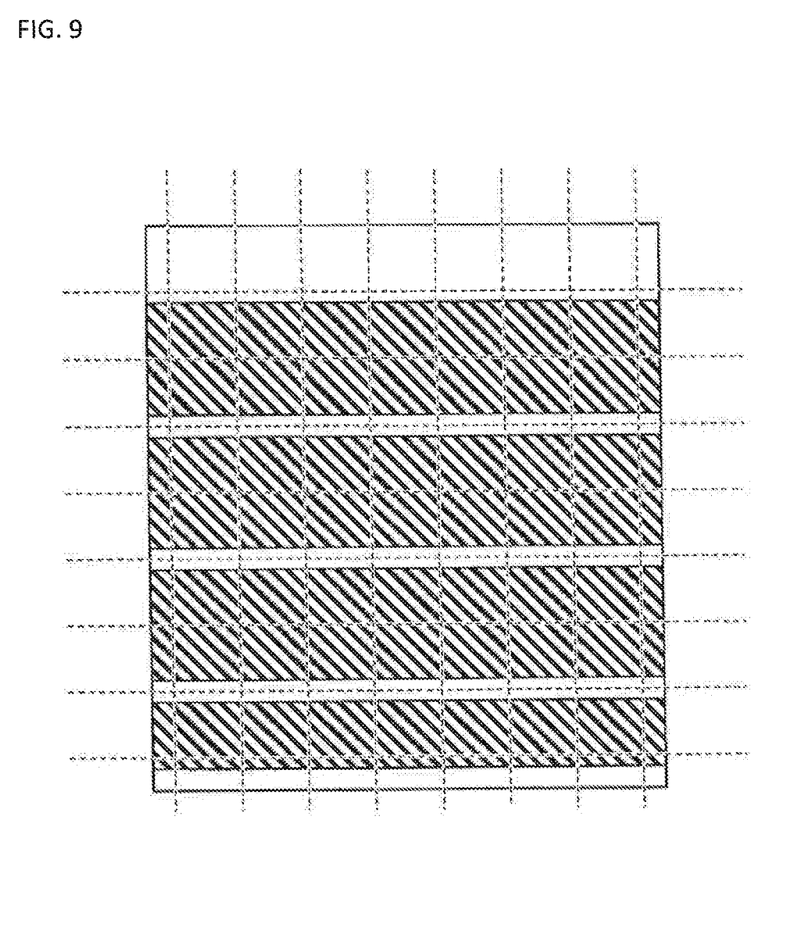
FIG. 9 is a plan view of an insulating paste applied on the surface of a thermoelectric conversion material sheet in an experiment.
Figure 10:
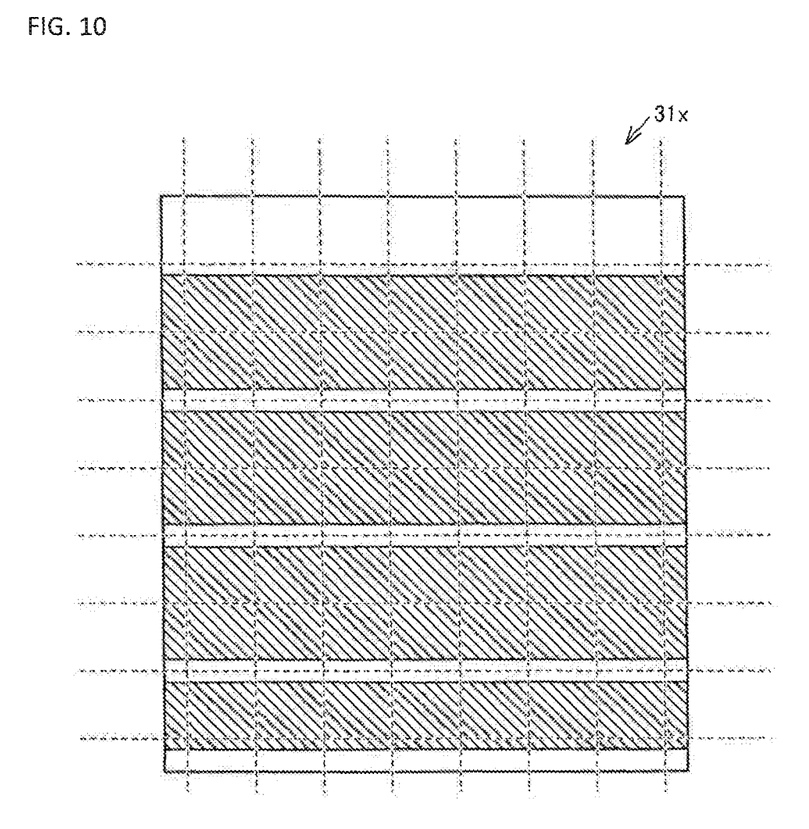
FIG. 10 is a plan view of a Ni paste applied on the surface of a thermoelectric conversion material sheet in an experiment.

Onto the obtained p-type and n-type thermoelectric conversion material sheets, the prepared insulating paste was applied in the pattern shown in FIG. 9, so as to be 10 μm in thickness. In FIG. 9, the thickly hatched portions indicate portions covered with the insulating paste. In this way, insulating layers were formed so as to partially cover over the surfaces of the p-type and n-type thermoelectric conversion material sheets. To form the pair of p-type thermoelectric conversion material sheets 31x (FIG. 8) used as the outermost layers (without any insulating layer formed), a 10 μm in thickness Ni paste was applied in the pattern shown in FIG. 10. In FIG. 10, the thinly hatched portions indicate portions covered with the Ni paste. The Ni paste is intended to subsequently serve as Ni films.

As Example 1, the p-type and n-type thermoelectric conversion material sheets were combined and stacked as shown in FIG. 8, and then subjected to temporal pressure bonding. The p-type thermoelectric conversion material sheets with no insulating layer formed are repeatedly stacked near the uppermost layer and the lowermost layer.

The internal composition of the stacked body subjected to temporary pressure bonding has the p-type thermoelectric conversion material layers including the Ni paste layers to be external electrodes: 120 μm in thickness, the p-type thermoelectric conversion material layers with the insulating layers formed: 30 μm in thickness, and the n-type thermoelectric conversion material layers with the insulating layers formed: 140 μm in thickness. The sheets were stacked so that fifty pairs of p-type and n-type were formed within the element.

The cut stacked body was subjected to pressure bonding at 180 MPa by an isostatic press method, thereby providing a compact. This compact was cut with a dicing saw into a predetermined size to obtain a green body.

The obtained compact was subjected to degreasing at 270° C. in the atmosphere. Thereafter, a fired body was obtained by firing at 1200 to 1300° C. in a reducing atmosphere with an oxygen partial pressure of 10-10 to 10-15 MPa. The applied Ni paste films were fired to turn into Ni films. The obtained fired body was subjected to deburring treatment by wet barrel polishing. The amount of edges removed by the barrel polishing in this case was 100 μm.

Thereafter, electrolytic Ni plating was carried out. The four surfaces other than the two surfaces with external electrodes to be formed were polished to remove excess Ni films. In this way, a laminated thermoelectric conversion element was prepared with only the two surfaces provided with external electrodes.

Figure 11:
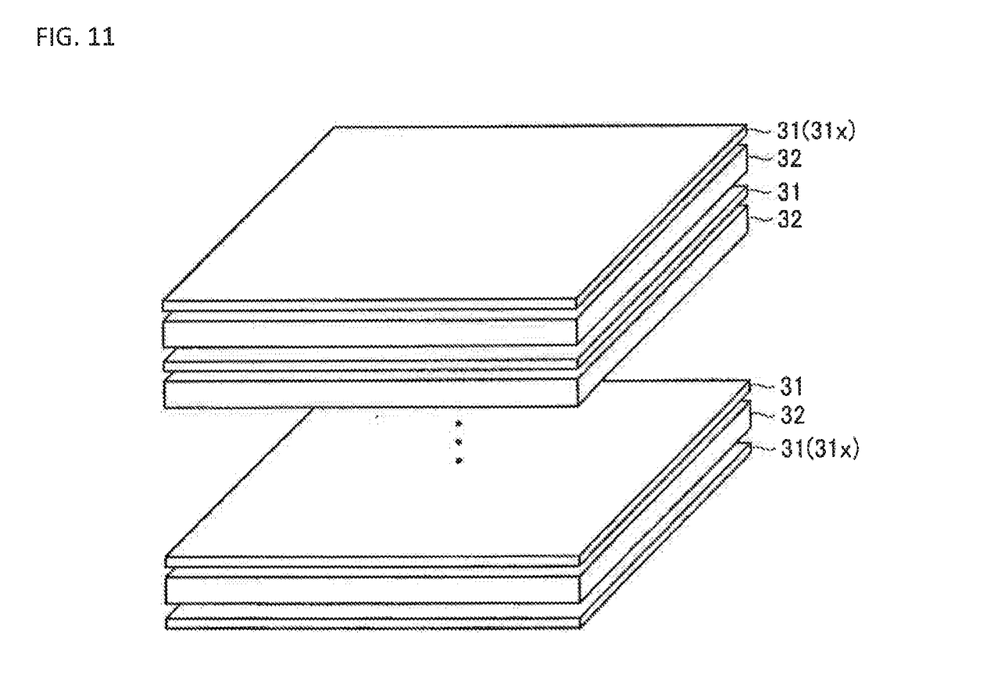
FIG. 11 is an explanatory diagram of a large-sized stacked body formed for achieving a comparative example in an experiment performed for verifying advantageous effects of the present invention.

As a comparative example, p-type and n-type thermoelectric conversion material sheets combined and stacked as shown in FIG. 11 were subjected to the respective steps in the same way to prepare a laminated thermoelectric conversion element.

Ten samples of Example 1 and ten samples of the comparative example were prepared and subjected to electrical resistance measurement. The measurement results are shown in Table 1.

TABLE 1

| Sample Number | Example 1 | Comparative Example |
|---|---|---|
| 1 | 7.6 | 100 or more |
| 2 | 6.8 | 97 |
| 3 | 6.5 | 100 or more |
| 4 | 6.6 | 100 or more |
| 5 | 7.1 | 87 |
| 6 | 7.2 | 84 |
| 7 | 6.9 | 100 or more |
| 8 | 7.2 | 79 |
| 9 | 6.8 | 100 or more |
| 10 | 6.7 | 100 or more |

As shown in Table 1, the samples according to Example 1 are all low in electrical resistance, whereas the samples according to the comparative examples are all high in electrical resistance, some of which are 100Ω or more.

From the experimental results, it is clear that Example 1 according to the present invention is superior to the comparative example at least in regard to the electrical resistance. Accordingly, it has been demonstrated that increasing thickness of a so-called outer layer near the end surface makes it possible to keep the electrical resistance of the laminated thermoelectric conversion element low even in the condition subjected to barrel polishing, thereby successfully preventing defective insulation.

It is to be noted that the embodiments disclosed therein are considered by way of example in all respects, but not to be considered limiting. The scope of the present invention is specified by the claims, but not the foregoing description, and considered to encompass all modifications within the spirit and scope equivalent to the claims.

INDUSTRIAL APPLICABILITY

The present invention can be used for laminated thermoelectric conversion elements.

The invention claimed is:

1. A thermoelectric conversion element having a central axis, the thermoelectric conversion element comprising:
   (a) first and second opposed end surfaces extending perpendicular to the central axis;
   (b) opposed heat absorption and heat release surfaces extending parallel to the central axis;
   (c) first and second end portions located adjacent the first and second opposed end surfaces of the thermoelectric conversion element, respectively, and a central portion located between the first and second end portions, all as viewed along a plane extending parallel to the central axis;
   (d) a plurality of planar p-type and n-type thermoelectric conversion material layers each lying in a respective plane extending perpendicular to the central axis and having a respective thickness as measured along the central axis, the p-type and n-type thermoelectric conversion material layers being arranged in an alternating fashion between the first and second end surfaces to define a plurality of unique pairs of adjacent n-type and p-type thermoelectric conversion material layers, the adjacent thermoelectric conversion layers of each unique pair having opposed main surfaces which face one another to define a respective interface;
   (e) a plurality of insulating layers, each insulating layer being associated with a respective unique pair of adjacent n-type and p-type thermoelectric conversion material layers and extending part way into the interface of the unique pair such that a first portion of the opposed main surfaces of the respective unique pair abut one another and a second portion of the opposed main surfaces of the respective unique pair are separated the associated insulating layer to form a serpentine path for the flow of current between the first and second opposed end surfaces of the thermoelectric conversion element, the first portion of the opposed main surfaces of each of the unique pairs being substantially the same length; and
   (f) a plurality of the n-type thermoelectric conversion material layers being located in the central portion, each of these being rectangular in cross section as viewed in a plane extending perpendicular to the central axis, the respective thickness of each of the n-type thermoelectric conversion material layers located in the central portion being the same and being an n-type basic thickness, the first end portion comprising a first outermost one of the n-type thermoelectric conversion material layers whose respective thickness is greater than the n-type basic thickness and which has a rounded surface which does not extend to beyond the interface between the first outermost one of the n-type thermoelectric conversion material layers and its adjacent p-type thermoelectric conversion layer in a direction extending perpendicular to the opposed heat absorption and heat release surfaces.

2. The thermoelectric conversion element according to claim 1, wherein the respective thickness of the first outermost one of the n-type thermoelectric conversion material layers is twice the n-type basic thickness.

3. The thermoelectric conversion element of claim 2, wherein the first outermost one of the n-type thermoelectric conversion material layers is formed of a single, unitary n-type thermoelectric conversion layer.

4. The thermoelectric conversion element of claim 2, wherein the first outermost one of the n-type thermoelectric conversion material layers is formed of a pair of adjacent unitary n-type thermoelectric conversion material sub-layers.

5. The thermoelectric conversion element of claim 4, wherein each of the adjacent unitary n-type thermoelectric conversion material sub-layers has a thickness, as measured along the central axis, that is equal to the n-type basic thickness.

6. The thermoelectric conversion element according to claim 1, wherein the second end portion comprises a second outermost one of the n-type thermoelectric conversion material layers whose respective thickness is greater than the n-type basic thickness and a rounded outer surface which does not extend to the interface between the second outermost one on the n-type thermoelectric conversion material layers and its adjacent p-type thermoelectric conversion element.

7. The thermoelectric conversion element according to claim 6, wherein the first and second outermost ones of the n-type thermoelectric conversion material layers are each formed of a respective single, unitary thermoelectric conversion layer.

8. The thermoelectric conversion element of claim 6, wherein the first and second outermost ones of the n-type thermoelectric conversion material layers are each formed of a respective pair of adjacent unitary n-type thermoelectric conversion material sub-layers.

9. The thermoelectric conversion element of claim 8, wherein each of the adjacent unitary n-type thermoelectric conversion material sub-layers has a thickness, as measured along the central axis, that is equal to the n-type basic thickness.

10. A thermoelectric conversion element having a central axis, the thermoelectric conversion element comprising:
(a) first and second opposed end surfaces extending perpendicular to the central axis;
(b) opposed heat absorption and heat release surfaces extending parallel to the central axis;
(c) first and second end portions located adjacent the first and second opposed end surfaces of the thermoelectric conversion element, respectively, and a central portion located between the first and second end portions, all as viewed along a plane extending parallel to the central axis;
(d) a plurality of planar p-type and n-type thermoelectric conversion material layers each lying in a respective plane extending perpendicular to the central axis and having a respective thickness as measured along the central axis, the p-type and n-type thermoelectric conversion material layers being arranged in an alternating fashion between the first and second end surfaces to define a plurality of unique pairs of adjacent n-type and p-type thermoelectric conversion material layers, the adjacent thermoelectric conversion layers of each unique pair having opposed main surfaces which face one another to define a respective interface;
(e) a plurality of insulating layers, each insulating layer being associated with a respective unique pair of adjacent n-type and p-type thermoelectric conversion material layers and extending part way into the interface of the unique pair such that a first portion of the opposed main surfaces of the respective unique pair abut one another and a second portion of the opposed main surfaces of the respective unique pair are separated the associated insulating layer to form a serpentine path for the flow of current between the first and second opposed end surfaces of the thermoelectric conversion element, the first portion of the opposed main surfaces of each of the unique pairs being substantially the same length; and
(f) a plurality of the p-type thermoelectric conversion material layers being located in the central portion, each of these being rectangular in cross section as viewed in a plane extending perpendicular to the central axis, the respective thickness of each of the p-type thermoelectric conversion material layers located in the central portion being the same and being a p-type basic thickness, the first end portion comprising a first outermost one of the p-type thermoelectric conversion material layers whose respective thickness is greater than the p-type basic thickness and which has a rounded surface which does not extend to beyond the interface between the first outermost one of the p-type thermoelectric conversion material layers and its adjacent n-type thermoelectric conversion layer in a direction extending perpendicular to the opposed heat absorption and heat release surfaces.

11. The thermoelectric conversion element according to claim 10, wherein the respective thickness of the first outermost one of the p-type thermoelectric conversion material layers is twice the p-type basic thickness.

12. The thermoelectric conversion element of claim 11, wherein the first outermost one of the p-type thermoelectric conversion material layers is formed of a single, unitary thermoelectric conversion layer.

13. The thermoelectric conversion element of claim 12, wherein the first outermost one of the p-type thermoelectric conversion material layers is formed of a pair of adjacent unitary p-type thermoelectric conversion material sub-layers.

14. The thermoelectric conversion element of claim 13, wherein each of the adjacent unitary p-type thermoelectric conversion material sub-layers has a thickness, as measured along the central axis, that is equal to the p-type basic thickness.

15. The thermoelectric conversion element of claim 10, wherein the outermost one of the n-type thermoelectric conversion material layers is formed of a single, unitary thermoelectric conversion layer.

16. The thermoelectric conversion element of claim 10, wherein the outermost one of the n-type thermoelectric conversion material layers is formed of a respective pair of adjacent unitary n-type thermoelectric conversion material sub-layers.

17. The thermoelectric conversion element of claim 16, wherein each of the adjacent unitary n-type thermoelectric conversion material sub-layers has a thickness, as measured along the central axis, that is equal to the n-type basic thickness.

18. A thermoelectric conversion element having a central axis, the thermoelectric conversion element comprising:
(a) first and second opposed end surfaces extending perpendicular to the central axis;
(b) opposed heat absorption and heat release surfaces extending parallel to the central axis;

(c) first and second end portions located adjacent the first and second opposed end surfaces of the thermoelectric conversion element, respectively, and a central portion located between the first and second end portions, all as viewed along a plane extending parallel to the central axis;

(d) a plurality of planar p-type and n-type thermoelectric conversion material layers each lying in a respective plane extending perpendicular to the central axis and having a respective thickness as measured along the central axis, the p-type and n-type thermoelectric conversion material layers being arranged in an alternating fashion between the first and second end surfaces to define a plurality of unique pairs of adjacent n-type and p-type thermoelectric conversion material layers, the adjacent thermoelectric conversion layers of each unique pair having opposed main surfaces which face one another to define a respective interface;

(e) a plurality of insulating layers, each insulating layer being associated with a respective unique pair of adjacent n-type and p-type thermoelectric conversion material layers and extending part way into the interface of the unique pair such that a first portion of the opposed main surfaces of the respective unique pair abut one another and a second portion of the opposed main surfaces of the respective unique pair are separated the associated insulating layer-to form a serpentine path for the flow of current between the first and second opposed end surfaces of the thermoelectric conversion element, the first portion of the opposed main surfaces of each of the unique pairs being substantially the same length; and (f) a plurality of the n-type thermoelectric conversion material layers being located in the central portion, the respective thickness of each of the n-type thermoelectric conversion material layers located in the central portion being the same and being an n-type basic thickness, the first end portion comprising a first outermost one of the n-type thermoelectric conversion material layers whose respective thickness is greater than the n-type basic thickness, which has an outer surface which extends to the interface between the first outermost one of the n-type thermoelectric conversion material layers and its adjacent p-type thermoelectric conversion layer and which forms a right angle with that interface, at least part of the outer surface being rounded.

19. The thermoelectric conversion element according to claim 18, wherein the respective thickness of the first outermost one of the n-type thermoelectric conversion material layer is twice the n-type basic thickness.

20. The thermoelectric conversion element according to claim 18, wherein the second end portion comprises a second outermost one of the n-type thermoelectric conversion layers whose thickness is greater than the n-type basic thickness and a rounded outer surface which does not extend to the interface between the second outermost one on the n-type thermoelectric conversion material layers and its adjacent p-type thermoelectric conversion element.

\* \* \* \* \*